(12) United States Patent
McKenzie et al.

(10) Patent No.: US 8,324,647 B2
(45) Date of Patent: Dec. 4, 2012

(54) LIGHT EMITTING MODULE WITH OPTICALLY-TRANSPARENT THERMALLY-CONDUCTIVE ELEMENT

(75) Inventors: James Stuart McKenzie, Falmouth (GB); Majd Zoorob, Southampton (GB)

(73) Assignee: PhotonStar LED Limited, Romsey (GB)

(*) Notice: Subject to any disclaimer, the term of this patent is extended or adjusted under 35 U.S.C. 154(b) by 43 days.

(21) Appl. No.: 12/864,875

(22) PCT Filed: Jan. 28, 2009

(86) PCT No.: PCT/GB2009/000238
§ 371 (c)(1),
(2), (4) Date: Jul. 28, 2010

(87) PCT Pub. No.: WO2009/095662
PCT Pub. Date: Aug. 6, 2009

(65) Prior Publication Data
US 2011/0001157 A1    Jan. 6, 2011

(30) Foreign Application Priority Data
Jan. 28, 2008 (GB) .................................. 0801509.1

(51) Int. Cl.
*H01L 33/00* (2010.01)
*H01L 21/00* (2006.01)

(52) U.S. Cl. ........... 257/98; 257/E33.065; 257/E33.072; 438/29

(58) Field of Classification Search .................... 257/98, 257/E33.065, E33.072; 438/22, 26, 29
See application file for complete search history.

(56) References Cited

U.S. PATENT DOCUMENTS

| | | | |
|---|---|---|---|
| 7,196,354 B1 | 3/2007 | Erchak et al. | |
| 2003/0214225 A1* | 11/2003 | Yamada et al. | 313/485 |
| 2006/0198418 A1 | 9/2006 | Hama et al. | |
| 2007/0246712 A1 | 10/2007 | Kim et al. | |

FOREIGN PATENT DOCUMENTS

| | | |
|---|---|---|
| EP | 1 589 591 | 10/2005 |
| EP | 1 681 728 | 7/2006 |
| JP | 2006-270088 | * 10/2006 |
| WO | 2007/108663 | 9/2007 |

OTHER PUBLICATIONS

International Search Report and Written Opinion of International Application No. PCT/GB2009/000238, dated May 27, 2009.
UK Search Report for GB Application No. 0801509.1, dated May 16, 2008.

* cited by examiner

*Primary Examiner* — A. Sefer
*Assistant Examiner* — Nikolay Yushin
(74) *Attorney, Agent, or Firm* — Renner, Otto, Boisselle & Sklar, LLP

(57) ABSTRACT

A light emitting module with improved optical functionality and reduced thermal resistance is described, which comprises a light emitting device (LED), a wavelength converting (WC) element and an inorganic optically-transmissive thermally-conductive (OTTC) element. The WC element is capable of absorbing light generated from the LED at a specific wavelength and re-emitting light having a different wavelength. The re-emitted light and any unabsorbed light exits through at least one surface of the module. The OTTC is in physical contact with the WC element and at least partially located in the optical path of the light. The OTTC comprises one or more layers of inorganic material having a thermal conductivity greater than that of the WC element. As such, a compact unitary integrated module is provided with excellent thermal characteristics, which may be further enhanced when the OTTC provides a thermal barrier for vertical heat propagation through the module but not lateral propagation.

20 Claims, 10 Drawing Sheets

LIGHT EMITTING MODULE WITH OPTICALLY-TRANSPARENT THERMALLY-CONDUCTIVE ELEMENT

This application is a national phase of International Application No. PCT/GB2009/000238 filed Jan. 28, 2009, and published in the English language as WO 2009/095662 on Aug. 6, 2009.

FIELD OF THE INVENTION

The present invention relates to a solid state lighting module having a low thermal resistance and a method for producing such, which employs a wavelength converting element and an optically-transparent thermally-conducting element.

BACKGROUND TO THE INVENTION

Light emitting devices and diodes are based on a forward biased p-n junction. LEDs have recently reached high brightness levels that have allowed them to enter into new solid state lighting applications as well as replacements for high brightness light sources such as light engines for projectors and automotive car headlights. These markets have also been enabled by the economical gains achieved through the high efficiencies of LEDs, as well as reliability, long lifetime and environmental benefits. These gains have been partly achieved by use of LEDs that are capable of being driven at high currents and hence produce high luminous outputs while still maintaining high wall plug efficiencies.

Solid state lighting applications require that LEDs exceed efficiencies currently achievable by alternative incandescent and fluorescent lighting technologies. The efficiencies of LEDs can be quantified by three main factors, internal quantum efficiency, injection efficiency, and the extraction efficiency. The latter being the basis for the present invention. Several other factors affect the overall efficiency of solid state lighting applications such as phosphor conversion efficiency and electrical driver efficiency, however, these are beyond the scope of the present invention.

It is also of particular interest to maintain the small format light emitting device at a low temperature during operation as the junction temperate of the LED dramatically affects both its life time and its overall efficiency. As a basic rule every 10° C. increase (above 25° C.) in junction temperature reduces the life time of the LED by 10 kHrs for a Galium Nitride LED. It is also a consequence of the increase of the junction temperature that the overall efficiency of a state of the art vertical type LED drops, for example, increasing the junction temperature from 40° C. to a 70° C. will reduce the efficacy of the LEDs by more than 10%. It is noted that this effect increasingly becomes nonlinear in behaviour. Thus, appropriate packaging solutions need to be developed to ensure performance is maintained and the operating temperature of the light emitting device is maintained for a given change in the junction temperature as well as the ambient temperature.

The Thermal Resistance of a package is the measure of how well a package can conduct heat away from the junction of the LED. Current state of the art modules have a thermal resistance of between 4 and 8 K/W.

Many methods have been successfully employed to improve the thermal resistance of LED module packages. These include the use of shaped metal lead frames in array formats U.S. Pat. No. 6,770,498, the use of bulk Aluminium Nitride ceramic tiles with electrical tracking on top in U.S. Patent Application 2006/0091415A1 and the use of flip chip LEDs onto tracked ceramic tiles with through vias to allow surface mounting U.S. Patent Application 2006/0091409A1.

The LEDs themselves have been engineered to produce a low thermal resistance path from the junction to the package where the heat is spread such as the flip chip approach described above (U.S. Patent Application 2006/0091409A1) where the junction is very close to the package. Another approach to provide LEDs with high current and thermal driving capabilities the vertical type n-p contact configuration in GaN material systems has been recently adopted an example of which has been disclosed in U.S. Pat. No. 6,884,646 and published U.S. Patent application 20060154389A1. These use high thermal conductivity materials such as Copper to provide low thermal resistance from the junction to the package. More recently, improvements to these vertical type LED designs with respect to optical extraction performance promise even greater wall plug efficiency chips as described in UK patent applications 0704120.5 and 0714139.3.

U.S. Pat. No. 7,196,354 describes wavelength-converting light-emitting devices having a thermally conductive region in contact with the wavelength converting region, wherein the thermally conductive region comprises a material having a thermal conductivity greater than that of the wavelength converting element. In one embodiment the thermally conductive material is optically non-transmissive and is designed to reflect the wavelength converted light. This leads to cumbersome additional reflective surfaces being introduced to re-direct and emit the wavelength converted light. Additionally, a larger light emitting package is required to accommodate the additional reflective thermally conductive surfaces. It is also not desirable to introduce reflective surfaces in the path of the emitted light as this may introduce optical loss affecting the overall efficiency of the LED. Additionally, any optical loss will ultimately lead to increased phonon vibrations leading to increased thermal load in the device. In other embodiments, a window is fabricated separately which comprises a substrate on which a wavelength converting region and an optically-transparent thermally conductive region and are formed. This window is then located above a light-emitting device on a substrate and held in place by a suitable thermally-conducting frame to form a complete module. The fabrication of a separate window avoids the introduction of any thermally-induced stresses into the complete module. However, it does not result in a compact single integrated module, which can be fabricated in an efficient low cost in-line volume procedure.

In published U.S. Patent application 2007/0246712 a thermally conductive heat spreading plate, 108, is disposed between the Phosphor layer, 106 and the capping layer 107 of the light emitting chip 101, as shown in FIG. 1. The heat spreading layer comprises of a mixture of thermally conductive material embedded in a light transmissive material. This is proposed to improve the thermal conductivity of the light transmissive material and allow for extended lifetime at high power operation. However, infilling light transmissive material with thermally conductive materials causes modification in the optical transmissive properties of layer 108. As the percentage of thermally conductive material increases in the light transmitting material the opacity also increases. This is due to the dielectric contrast between the crystalline thermally conductive materials and the light transmissive material introducing increased scattering which dramatically reduces specular transmission of the incident light. The increased scattering introduces unwanted losses in the light emitting system as indicated by the publication. It is also noted that increased complexity in the preparation of the heat spreading plate is introduced, during preparation of the heat spreading plate material care has to be taken that the infilling material is uniformly dispersed in the resin otherwise adverse coagulation and flocculation of the thermal dissipating material arises increasing light loss in the material. Additionally, during infilling the thermal conductivity of the heat spreading plate will always be a fraction of the thermal material due to the unconnected network that it resides in.

SUMMARY OF THE INVENTION

According to a first aspect of the present invention a light emitting module comprises:
  a light emitting device having a light generating region for generating light when activated;
  a submount comprising a thermally conductive material, the light emitting device being attached to the submount;
  a wavelength converting element comprising a layer of material capable of absorbing light having a first wavelength generated by the light emitting device and re-emitting light having a second wavelength, the second wavelength being different to the first wavelength; and
  a conductive element which is arranged to be at least partially in physical contact with the wavelength converting element and at least partially located in a light path of the generated light, the conductive element comprising at least one layer of inorganic material which is thermally conductive, having a thermal conductivity greater than that of the wavelength converting element, and which is optically transparent at the first and second wavelengths, wherein the wavelength converting element and the conductive element have been formed over the light emitting device so as to create a unitary integrated structure.

The present invention provides a light emitting module with improved optical functionality as well as reduced thermal resistance. The device comprises a light emitting device (LED) which in operation is adapted to generate light, a wavelength converting (WC) element and an inorganic optically transmissive and thermally conductive (OTTC) element. The WC element is capable of absorbing light generated from the LED at a specific wavelength and re-emitting light having a different wavelength, namely the wavelength converted light emission (WCLE). The WCLE and any remaining unabsorbed light that is generated by the LED together form the total emitted light (TEL) and is allowed to escape from at least one surface of the light emitting module.

The OTTC is in physical contact with the WC element and at least partially located in the optical path of the TEL. The inorganic OTTC comprises a single layer material or a multiple layer material having a thermal conductivity greater than the thermal conductivity of the WC element. As such, the present invention provides a compact unitary integrated module, with excellent thermal characteristics. Both the WC and OTTC layers can be deposited in situ, completely obviating the need for separate assembly. Low temperature deposition of the OTTC element avoids the introduction of thermally-induced stresses into the module. Moreover, an array of modules can be fabricated on a single "wafer", which is then diced up to form individual modules.

In some embodiments, the conductive element comprises two or more stacked layers of inorganic materials, which are optically transparent at the first and second wavelengths and which may all be different. Preferably, at least one of the layers in the OTTC element comprises of a material with a thermal conductivity greater than 18 W/mK at room temperature.

Preferably, the conductive element is adapted to be thermally conducting in a plane parallel to the layer of inorganic material and to provide a thermal barrier in a direction perpendicular to the plane. Thus, it is preferred that at least one of the at least two stacked layers of inorganic material has a lower thermal conductivity than one or more of the other layers, thereby forming the thermal barrier in a direction perpendicular to the plane. In one embodiment the conductive element comprises three stacked layers of inorganic material, which are optically transparent at the first and second wavelengths, wherein the middle layer of the three layers has a lower thermal conductivity than the other two layers. The layer of lower thermal conductivity need only be sufficiently different to provide a thermal impedance mismatch, whereby heat is preferentially conducted away laterally along the layers of higher thermal conductivity material rather than crossing the thermal barrier.

In one embodiment, the OTTC is in physical contact with the WC element and resides between the LED and the WC element.

In another embodiment, the OTTC is in physical contact with the WC element and is located distal to the LED and proximal to the emitting surface of the light emitting module.

The layers of inorganic material for the OTTC may be selected from a group of optically transparent and thermally conductive materials which includes Aluminium Nitride, Aluminium Oxide, Silicon Nitride, Titanium Dioxide and Tantalum Pentoxide and Hafnium Oxide.

The OTTC and the first encapsulant element may further be in-filled with dispersed sub-micron features comprising but not limited to dielectric or metal colloids, dielectric or metal nanoshells, nano-columns, nano-rice or arbitrary shaped nanoclusters. This in-filling provides for improved thermal conductivity and increased optical refractive index to further improve light extraction out of the LED.

The OTTC can comprise of an optically transparent multilayer stack with at least two layers of different optical refractive index, wherein at least one of the layers has a thermal conductivity greater than the thermal conductivity of the WC element.

The optically transparent multilayer stack of the OTTC can be optically designed such that a substantial amount of the WCLE is reflected (wherein at least greater than 50% of incident WCLE light is reflected) and a substantial amount of the light generated by the LED is transmitted (wherein at least greater than 50% of the incident light is transmitted).

In another embodiment the light emitting module comprises a thermally conductive submount, a first encapsulant layer and a reflector cup for tailoring the far field emission profile of the TEL.

In another embodiment the OTTC is at least partially in physical contact with the thermally conductive submount.

In yet another embodiment, the reflector cup comprises a thermally conductive material and the OTTC is at least partially in physical contact with the reflector cup, wherein the thermal conductivity of the reflector cup is at least greater than the thermal conductivity of the WC element.

In another embodiment, the light emitting system further comprises a second encapsulation layer overcoating at least part of the WC element, wherein the top emitting surface of the encapsulation is textured or shaped to provide for improved light extraction and modified far field emission profile of the TEL.

In some embodiments, the WC element of the light emitting system further comprises of a single or multiple layer. Each layer may be capable of re-emitting light at different wavelengths, whereby the TEL is a superposition of the different wavelengths. The WC element may be formed of a group comprising an individual sheet, deposited or dispensed layers that is introduced in the light emitting system. An individual WC sheet may be physically attached to the OTTC layer and at least partially exposed to the light generated by the LED. This individual sheet may have an effective refractive index which is matched to the OTTC layer and to the first encapsulation layer.

According to a second aspect of the present invention, a method of manufacturing the light emitting module of the first aspect comprises the step of depositing the one or more inorganic layers of the OTTC element using one or more of the following evaporation or sputtering techniques: Plasma assisted or enhanced deposition, Ion Beam assisted deposition, electron beam assisted deposition, Remote Plasma assisted deposition, electron beam evaporation, open and closed field magnetron sputtering. The use of a low temperature deposition technique allows the unitary integrated module of the present invention to be fabricated with minimal introduction of thermally-induced stresses.

As will be appreciated by those skilled in the art, the present invention provides a compact and efficient light emitting module, which lends itself to mass production in cost effective fabrication process. The use of the inorganic OTTC element in the light emitting module allows for minimum colour temperature drift for the TEL and also further provides extended lifetime, even when used for high current drive applications.

BRIEF DESCRIPTION OF THE DRAWINGS

Examples of the present invention will now be described in detail with reference to the accompanying drawings, in which.

DETAILED DESCRIPTION

An object of the present invention is to provide a light emitting module comprising of a high luminous output semiconductor light emitting device and wavelength down converting material capable of withstanding a continuous high drive current and high power densities while still maintaining long lifetime and controlled colour temperatures with minimal degradation in characteristics of the wavelength converting element.

The invention can be incorporated in a light emitting device of any semiconductor material system such as, but not restricted to, InGaN, InGaP, InGaAs, InP, or ZnO. A GaN based light emitting diode (LED) having an epitaxial layer formed on a sapphire substrate is used as an example in the present invention. However, the present invention is not restricted to epitaxial layers grown on sapphire and may include Si, SiC, Ge, native free-standing GaN, AlN, LiAlO or any other growth and substrate technology. Additionally an LED with either a vertical or lateral current path (where in the vertical case the electrical current through the p and n doped materials is applied through substantially parallel contacts that allows current to flow through a vertical direction of the LED structure) may be employed for the present invention.

Figure 1:
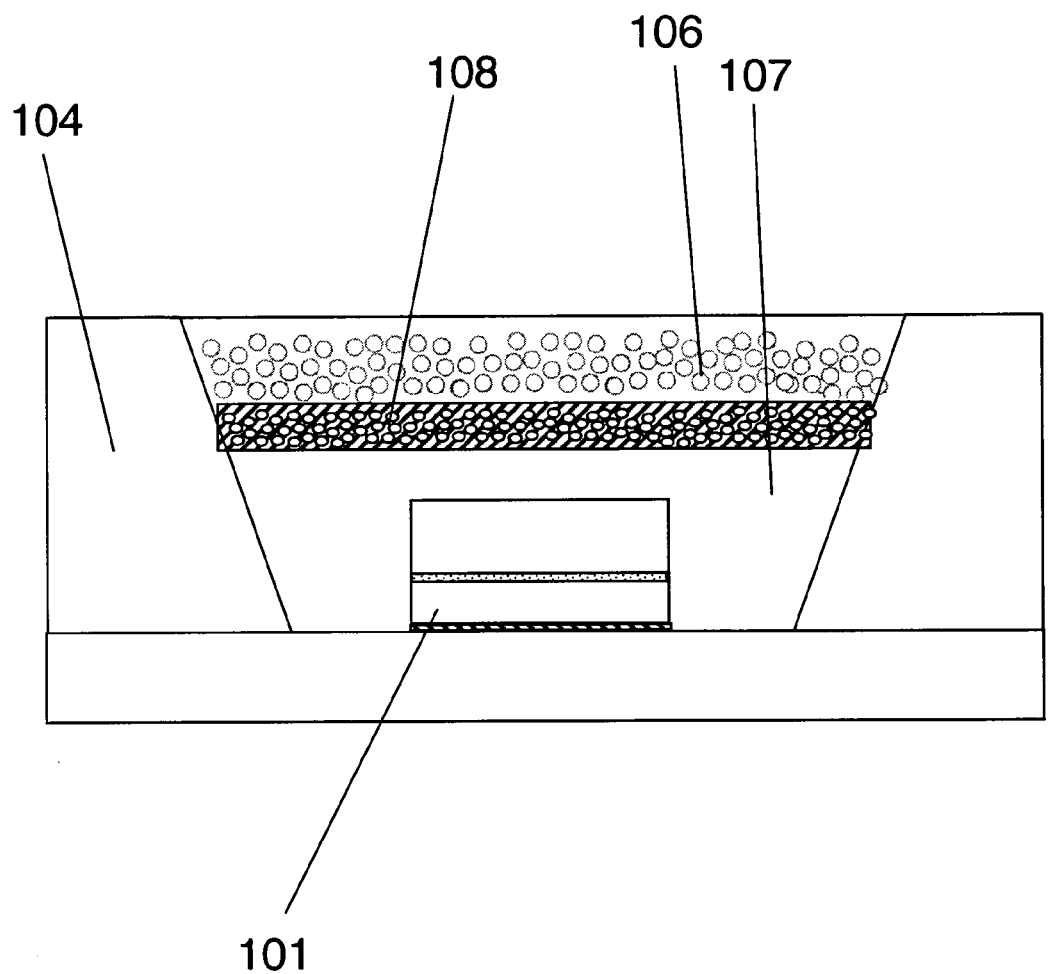
FIG. 1 shows a schematic plan view of a light emitting module of the prior art.
Figure 2:
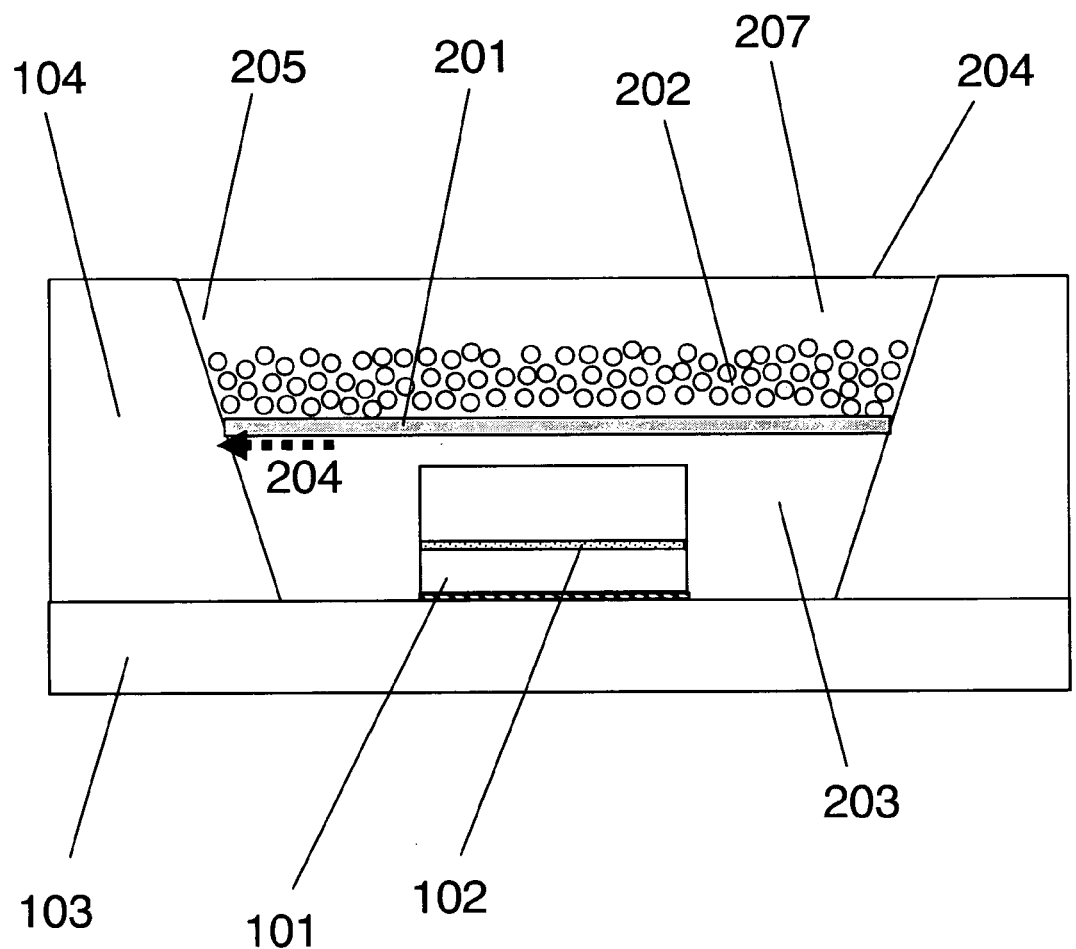
FIG. 2 shows a schematic cross sectional view of an example light emitting system with an OTTC element and reflector cup of the present invention.

In the first example of the present invention a light emitting module comprising an LED 101 supported on a thermally conductive submount 103 is shown in FIG. 2. The light emitting device (LED) which in operation is adapted to generate light from the light generating region 102. The light generated is allowed to escape from the LED 101 into a dielectric encapsulation layer 203. An inorganic optically transmissive and thermally conductive (OTTC) element 201 is introduced in the optical path of the light generated by 102 and resides on the top surface of the encapsulation layer 203. The OTTC is in physical contact with a wavelength converting (WC) element 202. In the present example the WC element resides on the top surface of the OTTC element. The WC element 202 is capable of absorbing light generated from the LED 101 at a specific wavelength and re-emitting light having a different wavelength, namely the wavelength converted light emission (WCLE). The re-emitted light can comprise of a broad emission of wavelengths. The WCLE and any remaining unabsorbed light that is generated by the LED together form the total emitted light (TEL). The TEL propagates into the second encapsulation layer 207 and is subsequently allowed to escape from the top surface of the layer 207, namely 204.

In other embodiments of the present invention the layers 201, 202, 203 and 207 reside partially or completely inside an optical reflector cup 104. The reflector cup resides on the submount 103 and is designed to reflect the proportion of the emitted TEL light that is substantially horizontal into the optical escape cone of the light emitting module. The reflector cup shape, height and slope angle can additionally be designed to modify the optical far field emission profile of the TEL. The far field emission can be further modified by employing a curved or multi-faceted cross-sectional face on the reflector cup. In order to eliminate trapping of optical modes residing inside the reflector cup 104, defects on the surface of 104 can be introduced, this is indicated by 205, these can comprise but not restricted to dimples or beads, random textured surface or high reflectivity back scattering white surfaces. It is also noted that the reflector cup surface 205 preferably comprises of a high specular or diffuse reflectivity coating of metal or dielectric. Examples of metals that may be used include Silver and Aluminium.

Layer 203 can comprise of dielectric material such as air but preferably an encapsulation or passivation layer such as but not limited to $SiO_2$, inorganic encapsulant, Silicon Oxynitride, Spin on glass (SOG), polymer, silicone, epoxy, acrylate, hydrogen silsesquioxane (HSQ), tetra-ethyl-ortho-silicate (TEOS), $TEOS/O_3$ or resin. The encapsulation 203 can also comprise of a mixture of such dielectrics as well as colloidal, clustered or porous type materials. Layer 203 may be applied using any deposition technique such as but not limited to sol gel process, chemical solution deposition, spin coating, dip coating, drop coating, sputtering, plasma deposition, vapour deposition, physical vapour deposition, evaporation, injection, conformal coating, spraying, plasma spraying or other technique. The layer 203 acts as an encapsulation layer and protects the LED 101 from environmental factors. The optically transparent layer 203 is also selected to have a high refractive index thus allowing for increased light extraction from the LED. The refractive index of layer 203 is preferably greater than 1.5, 1.6, 1.7 and greater than 1.8.

Layer 202 can comprise of any suitable Phosphor such as a rare-earth doped garnets, silicates or any other ceramic host material for example but not restricted to (Y,Gd,Sm)(Al,Ga) G:$Ce^{3+}$. These can reside in a colloidal, cluster or porous form and can be embedded in an encapsulant or can remain in a powder form. The Phosphor colloids may also further be coated with a lower optical refractive index shell or multilayer shell to allow for reduced optical scattering and improved effective refractive index matching between the high refractive index WC element and the surrounding medium within layer 202 or the surrounding air or encapsulant, $n_{surrounding\ medium}$. In a preferred embodiment the refractive index of the shell, $n_{coating}$ is designed to satisfy the following inequality $$n_{surrounding\ medium} < n_{coating} < n_{Phosphor} \quad (1)$$

whereby the refractive index of the phosphor is $n_{phosphor}$.

The reduced optical scattering also allows for improved optical transmission and greater light extraction from the package. The refractive index of the shell, $n_{coating}$ may be calculated by the following simplified equation:

$$n_{coating} = \sqrt{n_{Phosphor} \times n_{surrounding\ medium}} \quad (2)$$

The thickness of the shell, $t_{coating}$, may be optimised by utilising a thickness that best matched for anti-reflection using the following equation:

$$t_{coating} = \lambda / 4 n_{coating} \quad (3)$$

It is noted that this is only accurate when the radius of the Phosphor colloid or cluster $r_{cluster}$ is much larger than the wavelength of light, $\lambda$. Hence for a more accurate prediction of the thickness of the coating layer techniques such as Mie scattering, Finite-Difference Time Domain or Finite Element Methods is employed.

In a preferred example, the light generated in 102 and the re-emitted light from the WC layer 202 which form the TEL light is optimised to achieve white light emission of a desired colour temperature and CRI. The optimisation can be achieved by varying the percentage weight composition of WC element residing in the light emitting module as well as the geometry and thickness of the layer 202.

The inorganic OTTC layer may comprise but not restricted to an amorphous or crystalline phase. The OTTC element may also be deposited as a dense, porous, colloidal, macroporous, clustered or columnar film.

In a preferred embodiment the inorganic OTTC layer is deposited using a low temperature deposition technique and the thickness ranges from approximately 10 nm, approximately 20 nm, approximately 40 nm to approximately 20 microns, approximately 40 microns, or from approximately 100 microns.

During deposition, the OTTC element material properties are optimised for maximum optical transmittance at the desired thickness and across the complete spectrum of light generated by the LED and the complete TEL. It is also an object of the present invention that the OTTC material is also optimised to provide for optimal thermal conductivity.

The inorganic OTTC element may comprise a single layer material or a multiple layer material having a thermal conductivity greater than the thermal conductivity of the complete WC element and the encapsulation layer 203 and at least one of the materials residing in the OTTC element comprises of a thermal conductivity greater than 10 W/mK, greater than 15 W/mK, greater than 20 W/mK at room temperature. Examples of materials that may reside in the OTTC layer include but not restricted to DLC, Fluorinated DLC, CVD diamond, Aluminium Oxide (Al2O3), Aluminium Nitride, Silicon Nitride, Tantalum Pentoxide and Hafnium Oxide. Table 1 lists typical thermal conductivities and refractive indexes of example OTTC elements.

TABLE 1

| OTTC element | Refractive index | Thermal conductivity (typical W/mK) |
| --- | --- | --- |
| Aluminium Oxide | 1.63 | 25 |
| Aluminium Nitride | 2.11 | 140 |
| Silicon Nitride | 2.0 | 30 |

Phosphors wavelength conversion is sensitive to increased local temperature. This affects both the wavelength conversion efficiency as well as the emission wavelength. This adversely affects the total luminous efficiency of the light emitting module as well as the chromaticity of the light emitting module. In order to minimise the increased local temperature in the vicinity of the phosphor the OTTC element 201 thermally dissipates the heat across the element 204 and propagates towards the reflector cup 104. This acts as a preferential horizontal thermal spreader dissipating heat generated by 202 towards element 104 as shown by arrow 204. In the present example, the optical reflector cup 104 also comprises of a material that is thermally conductive such as Al or ceramic such as AlN or $Al_2O_3$. The reflector cup 104 hence acts as a bulk heat sink for the dissipated heat, whereby the thermal conductivity of the reflector cup is at least greater than the thermal conductivity of the WC element.

In a preferred embodiment of the present invention the OTTC element 201 forms a thermal barrier in the vertical direction comprising of at least 3 discrete layers subsequently deposited on to the encapsulation 203. This provides a barrier between the thermal heat generated by the LED and the Phosphor. In operation, current is injected into the light generating region 102 and heat is generated due to non-radiative recombination and phonon vibrations. This heat is conducted using a conductive sub-mount 103. However, during prolonged operation, the S-layer OTTC additionally introduces a thermal barrier isolating the local rise in temperature around the LED. The first and third layer of OTTC element comprise of high thermal conductivity layers as described in the present invention while the second layer disposed between the first and third layer is of low thermal conductivity less than or equal to the encapsulation layer 203. The spacer layer embedded in the OTTC allows for an induced temperature drop across the thickness of the layer thus reducing the temperature of the third layer. This dramatically reduces the onset of thermally induced phosphor degradation mechanisms contributing to the LED lifetime and high power capability of the module. Any heat generated by the Phosphor is dissipated horizontally towards the reflector cup as indicated by 204 by means of the third layer. Hence, the OTTC element acts as a thermal barrier for vertically dissipating heat namely from the LED and a horizontal thermally conducting multilayer for heat generated by the WC element 201.

The light emitting module may further comprise a second encapsulation layer 207. The encapsulation material is at least partially covering the Phosphor layer 202 and may be selected from the same group of materials selected for the encapsulation layer 203. However, typically the material is selected for prolonged protection from the surrounding environment as well as retention of shape. The optical refractive index of the material may be lower than that of encapsulation layer 203.

In another embodiment of the present invention the OTTC element 301 is in physical contact with the WC element, however in the present example it is located distal to the LED and proximal to the emitting surface of the light emitting module 204. This is highlighted in FIG. 3. In the present invention the OTTC element rapidly dissipates heat generated by the Phosphor material 202.

The OTTC, 202, and the first encapsulant element, 203, may further be in-filled with dispersed sub-micron or micron features comprising but not limited to dielectric or metal colloids, dielectric or metal nanoshells, nano-columns, nano-rice or arbitrary shaped nanoclusters. The in-filling provides for improved thermal conductivity and additionally allows for increased average effective refractive index to further improve light extraction out of the LED. The effective refractive index can be calculated using many different methods such as the volume average theory (VAT), Maxwell-Garnett theory or the effective medium theory such as the Bruggeman theory. It is important to note that the scattering cross section of the OTTC material will undesirably rise dramatically due to the size, wavelength, refractive index and density of the sub-micron features embedded in the OTTC element. It is additionally important to note that good dispersion of the features helps reduce the scattering loss of the OTTC element. Deflocculants, dispersants as well as sub-micron feature surface treatment and functionalisation may be used when embedding the sub-micron features into the first encapsulant material to reduce aggregation and coagulation.

Figure 4:
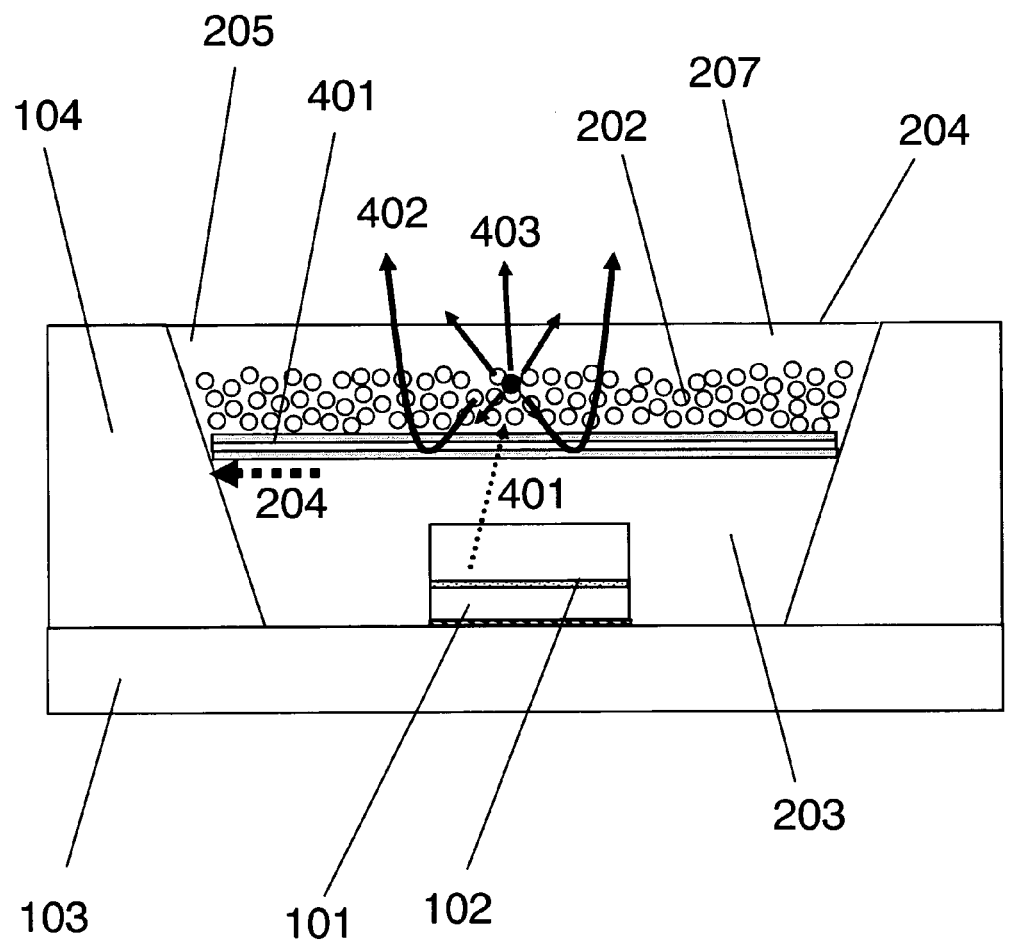
FIG. 4 shows a schematic cross sectional view of another example light emitting system of the present invention with an OTTC element comprising of a multilayer stack.

In another embodiment the OTTC can comprise of an optically transparent multilayer stack, 401, with at least two layers of different optical refractive index as shown in FIG. 4, whereby at least one of the layers having a thermal conductivity greater than the thermal conductivity of the WC element. The optical functionality of the OTTC multilayer may be designed to provide for improved performance such as the addition of an integral colour temperature maintaining filter or a bandpass filter for improved light extraction.

The individual OTTC multilayers can comprise of optically transparent materials such as but not restricted to the dielectric materials listed in Table 1. In order to achieve the desired optical effects it is typical to form successive layers of high and low refractive index layers. It is also desirable that the dielectric contrast between the layers is maximised in order to increase the dispersion effects of the multilayer with the minimum number of layers. As an example, for the high refractive index material the AlN material may be employed while in the case of the low index the $Al_2O_3$ material may be used. The optical characteristics of the multilayer optical stack can be analysed by using the transfer matrix method or other similar modelling technique. Some examples of possible multilayer stack configurations are Omni-directional reflectors, periodic, aperiodic, binary, rugate, graded index or quasiperiodic structures.

In the first example, the optically transparent multilayer stack of the OTTC can be designed such that a substantial amount the light generated by 101 is transmitted through the OTTC element as shown at 401. Preferably at least 50% of the light generated is designed to transmit through the OTTC multilayer on the first incidence, more preferably at least 60%, still more preferably at least 70%, even more preferably at least 80%, and most preferably at least 90%. At least some of the transmitted light is absorbed by the WC element and re-emitted as WCLE. Depending on the Phosphor scattering properties and phosphor colloid orientation the WCLE is emitted equally in all directions as shown by the solid black arrows. A substantial percentage of the downward emitted WCLE is reflected back by the OTTC multilayer as shown by arrow 402. Preferably at least 50%, more preferably at least 60%, still more preferably at least 70%, even more preferably at least 80%, and most preferably at least 90% of the downward emitted light is reflected back and is allowed to escape for the top surface of the light emitting module through surface 204. Any WCLE that is emitted upwards is also equally allowed to escape from the top surface 204.

Figure 5A:
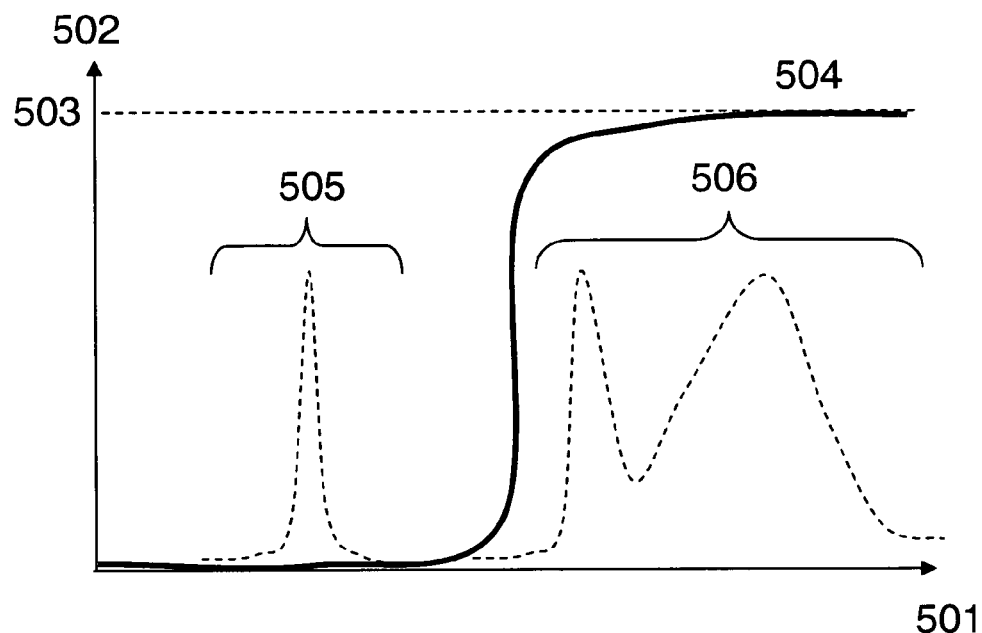
FIG. 5a shows a reflectivity versus wavelength plot of an example bandpass multilayer OTTC element of the light emitting module.

The bandpass reflectivity of the OTTC multilayer is shown in FIG. 5a. The characteristic reflectance, 502, of the bandpass filter 504, is plotted against wavelength 501. The said characteristics are superimposed on the TEL generated by a typical Blue wavelength LED with a yellow emission Phosphor designed to generate white light emission. The first blue band, 505, is associated with the light generated by 101 and experiences minimal light reflection back onto the LED 102. The second yellow band, 506 is associated with the WCLE and typically resides in the Green and Red wavelength region. Any WCLE emitted onto the OTTC layer is reflected back and not allowed to incident the LED 101. This provides for improved optical light extraction as WCLE light incident on an LED experiences a large percentage of loss.

In order to determine the TEL extraction efficiency of the light emitting module, both the extraction efficiency of the light generated by the LED, $T_{LED}$, needs to be determined:

$$T_{LED} = \sum_{n=1}^{N} t_{OTTC}^{LE} (r_{LED}^{LE} r_{OTTC}^{LE})^{n-1} \tag{4}$$

Also, the WCLE extraction efficiency, $T_{WCLE}$, is determined as follows:

$$T_{WCLE} = \frac{1}{2}(1 + r_{OTTC}^{WCLE}) + \frac{1}{2}\sum_{n=1}^{N} t_{OTTC}^{WCLE^2} (r_{OTTC}^{WCLE})^{n-1} (r_{LED}^{WCLE})^n \tag{5}$$

where $t_{OTTC}^{LE}$ and $r_{OTTC}^{LE}$ are the transmittance and reflectance of the light generated by the LED at the OTTC multilayer interface, while $r_{LED}^{LE}$ is the reflectance of light generated by the LED at the surface of the LED 101. In the case of eqn (5), the $$t_{OTTC}^{WCLE}$$

and $$r_{OTTC}^{WCLE}$$

are the transmittance and reflectance of the WCLE at the OTTC multilayer interface, while $r_{LED}^{WCLE}$ is reflectance of WCLE at the surface of the LED 101.

It is also important to note that the light emitting modules employ a photon recycling scheme to improve the extraction efficiency. However, care has to be taken to accommodate for the difference in the total extraction associated with the light generated by the LED and the WCLE as indicated by equation (4) and (5). This in turn affects the phosphor or wavelength converting element, 202, concentration utilised in the said light emitting module and may differ with respect conventional light emitting modules where no photon recycling is employed. It is an object of the present invention that less WC element 202 is employed than conventional light emitting modules with no photon recycling.

Figure 5B:
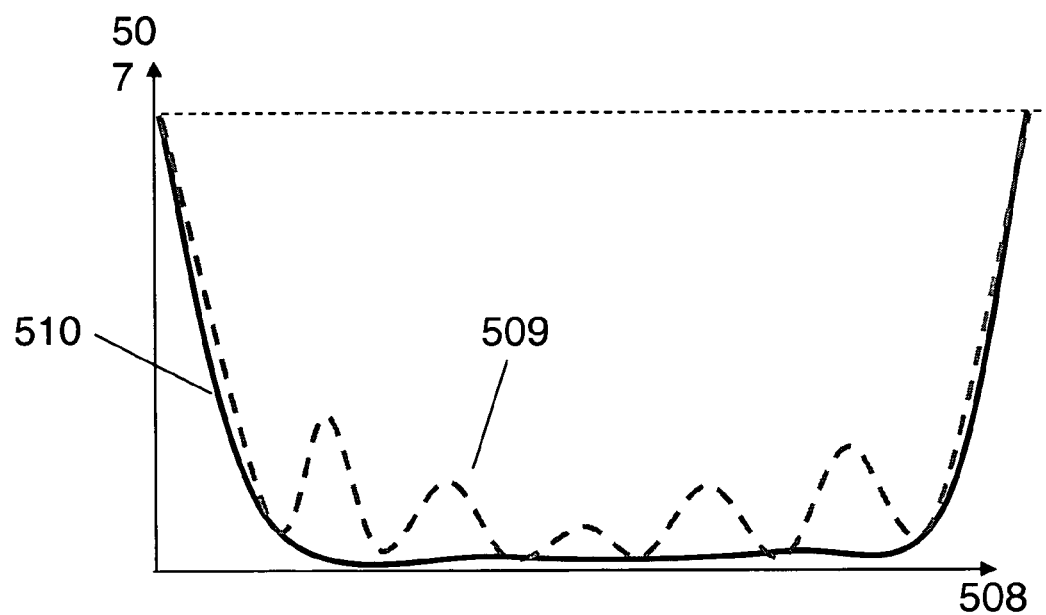
FIG. 5b shows a reflectivity versus wavelength plot of an example antireflection multilayer OTTC element of the light emitting module.

In the second example, an OTTC multilayer stack is designed to provide an anti-reflection (AR) optical coating between the WC layer 202 and the encapsulation layer 203. The anti-reflection layer is designed to minimise Fresnel reflections across all TEL wavelengths and across all incident optical ray angles. FIG. 5b demonstrates the operation of the AR coating OTTC layer. The reflectivity, 507 is plotted against incident angle 508. The reflections from a conventional WC layer, 509, are indicated with the dashed line. It is evident that when the said light generated by the LED, 401 is incident at a specific incident angle there is experienced a large Fresnel reflection. This adversely affects the overall efficiency of the light emitting module. In the case of the AR optimised OTTC multilayer, 510, the transmission spectrum enable efficient 401 light coupling at all angles and across the complete bandwidth of the light.

Figure 3:
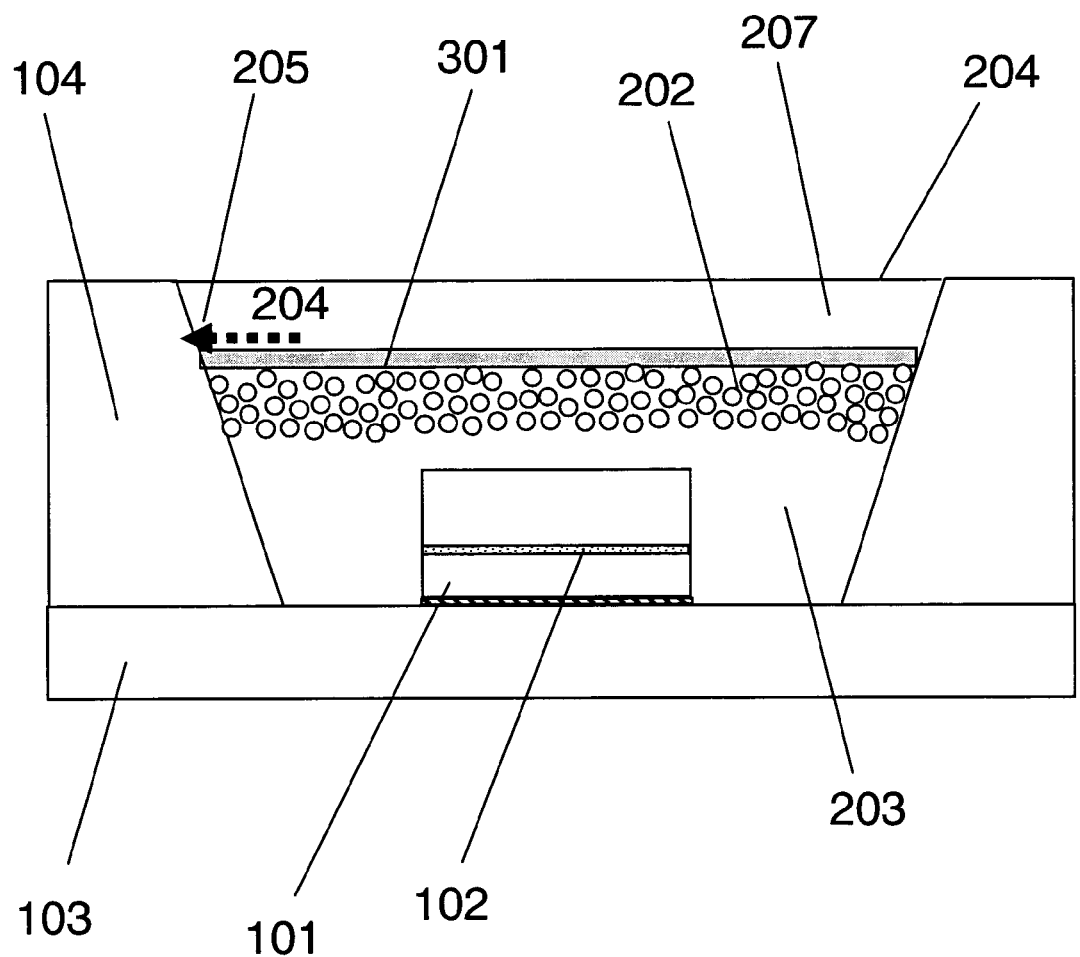
FIG. 3 shows a schematic cross sectional view of another example light emitting system of the present invention.
Figure 5C:
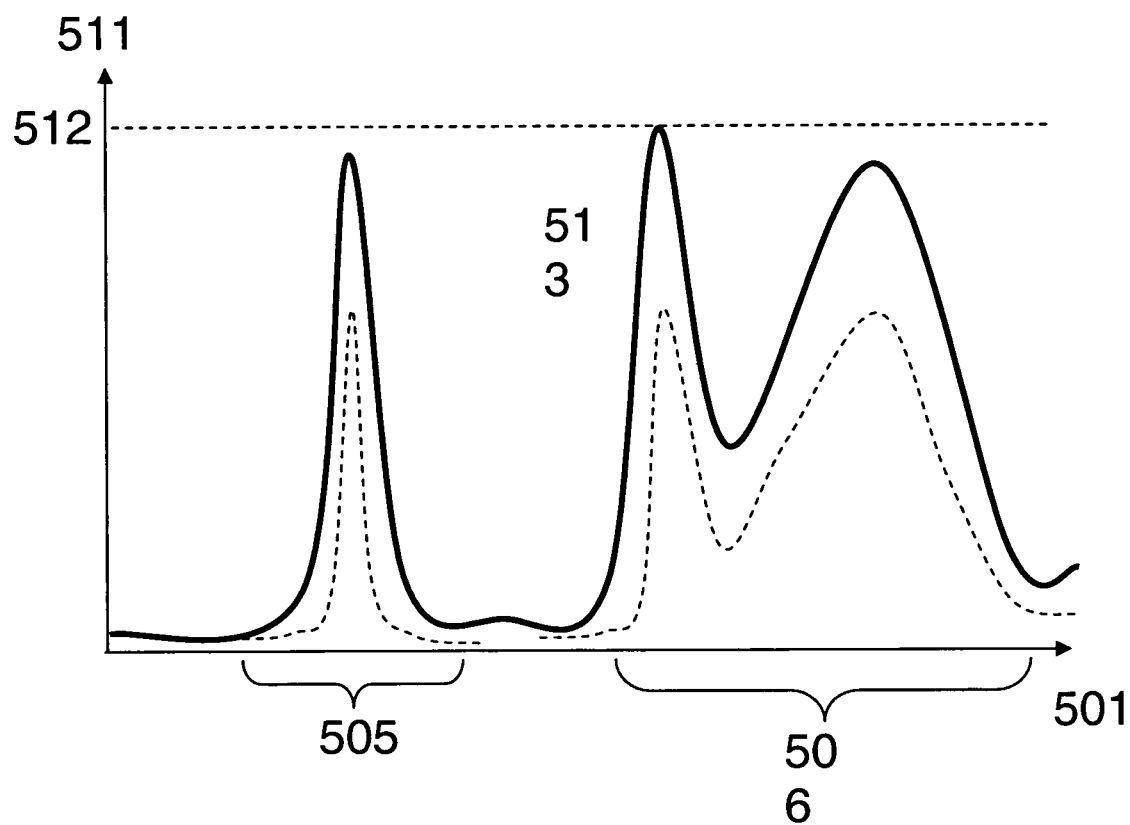
FIG. 5c shows a reflectivity versus wavelength plot of an example colour controlling bandpass multilayer OTTC element of the light emitting module.

In the third example an OTTC multilayer stack is designed to provide a colour correction (CC) optical coating between the WC layer 202 and the encapsulation layer 203 or above the WC layer 202 as shown in FIG. 3. The CC layer is designed to minimise drifts in colour temperature over lifetime as well as with increased local temperature of the WC element. FIG. 5c demonstrates a typical example of the optical transmittance spectrum 513 of the OTTC multilayer stack superimposed on the spectrum of the TEL of the light emitting module. The transmittance 511 is plotted against wavelength 501. In order to maintain the correct colour temperature of the light emitting module the relative intensities of different wavelengths needs to be accurately defined. This enables any drift in wavelength due to temperature or lifetime to be filtered out by only transmitting the desired wavelength at the desired intensity out of the light emitting module. The TEL profile for the light emitting module when operated in pulsed mode at low current drive and allowed to operate with a low junction temperature and WC element residing at room temperature is shown in the dashed lines 505 and 506.

Figure 6:
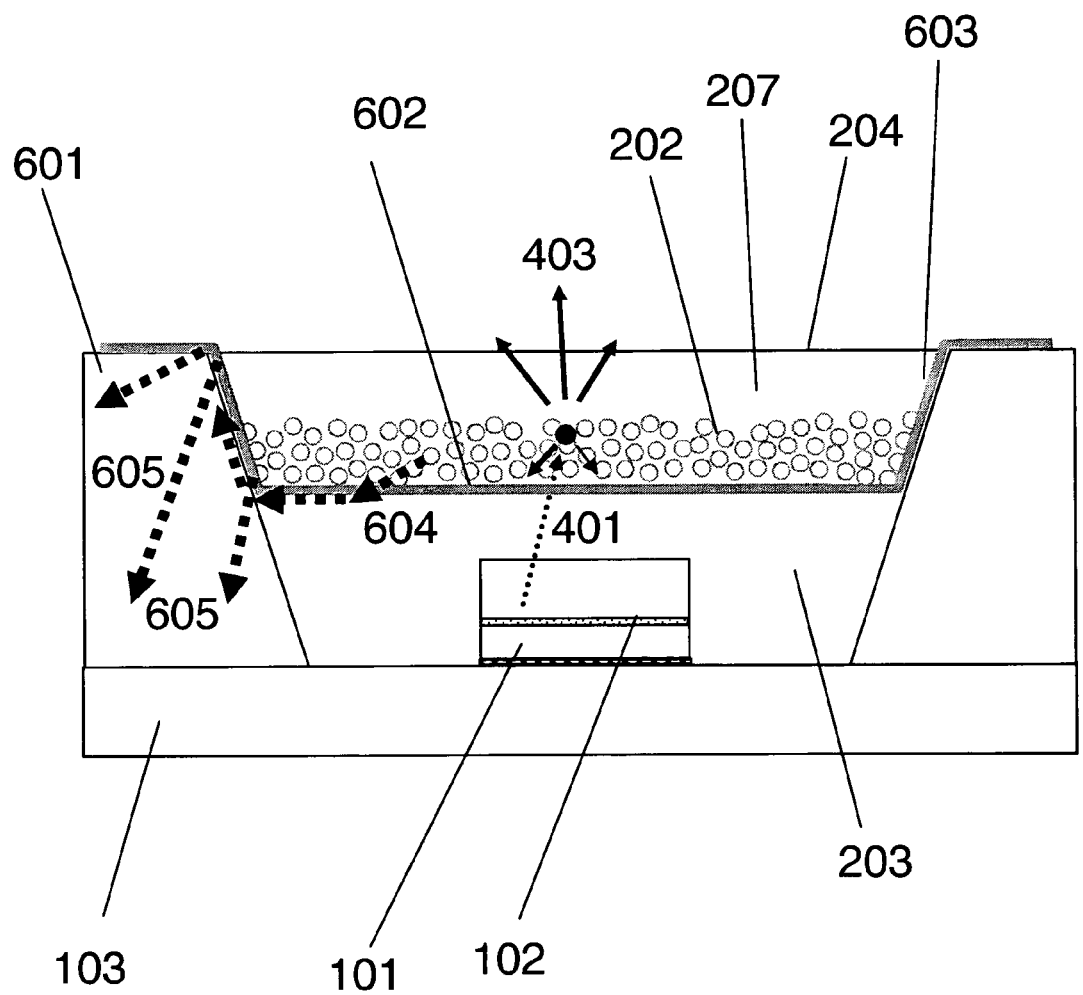
FIG. 6 shows a schematic cross sectional view of another example light emitting system of the present invention with an OTTC element at least partially in contact with the reflector cup.

In another embodiment the OTTC element 602 (indicated by the thick solid gray line) is allowed to extend across the top surface of the reflector cup 601 as shown in FIG. 6. The heat generated in the centre of the light emitting module by the WC elements is rapidly conducted 604 by the OTTC element towards the reflector cup 601. The increased contact surface area 603 between the OTTC element and the reflector cup 601 further improves the thermal dissipation and helps maintain an efficient heat sinking contact, as shown in 605, between the OTTC element and the reflector cup 601. Following the deposition of the layer 203 the large contact area of the OTTC element can be achieved by conformally depositing the OTTC material across the complete light emitting module with the application of no masking techniques. Following the deposition of the OTTC element the second encapsulation layer 207 may also be deposited at least partially across the surface of the OTTC element.

Figure 7:
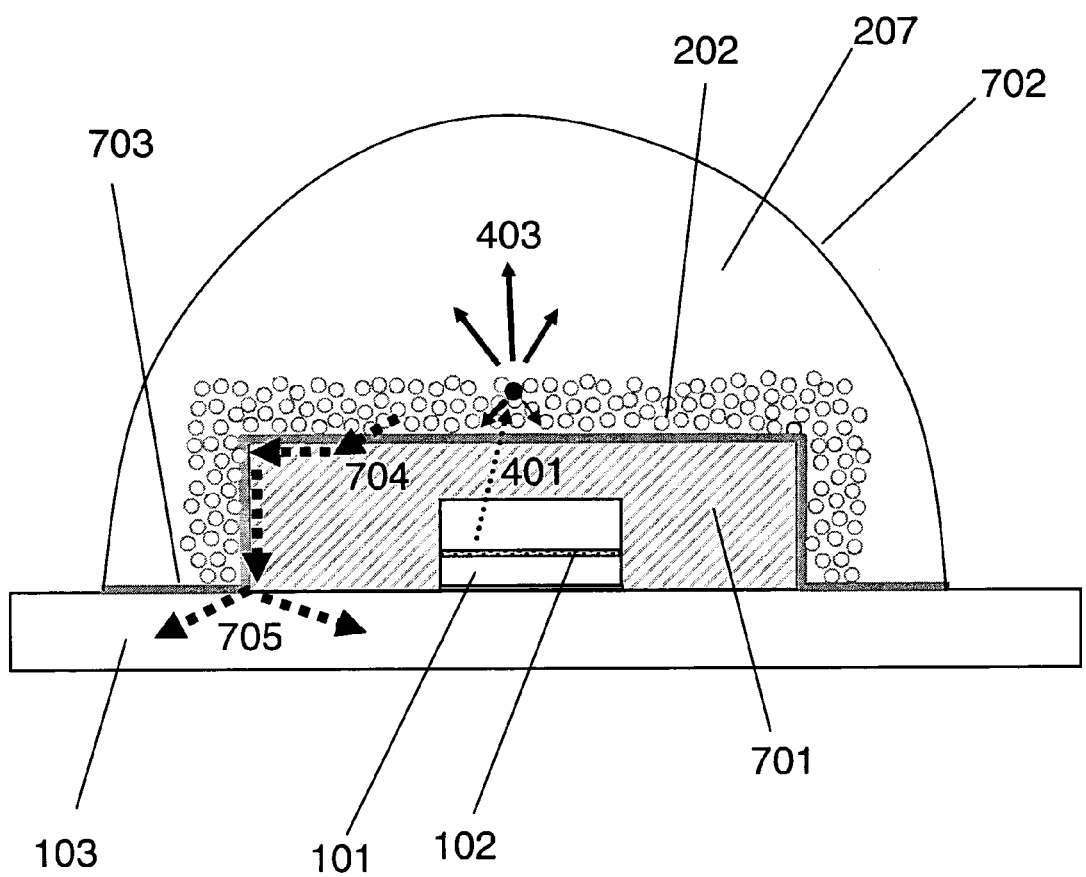
FIG. 7 shows a schematic cross sectional view of another example light emitting system of the present invention with an OTTC element at least partially in contact with the submount.

In another embodiment of the present invention a reflector cup is not employed in the light emitting module. In order to thermally conduct the heat from the WC element to a heat sink the OTTC element is at least partially in physical contact with thermally conductive submount 103. FIG. 7 demonstrates an example light emitting module of the present invention. A shaped encapsulant 701 is formed around the LED structure 101. The OTTC element 703 is conformally deposited on the surface of 701 and 103 to enable thermal dissipation, 704, from the WC element to the submount 705. The WC element is subsequently allowed to at least partially coat the OTTC element. It is noted that as the reflector cup no longer exists the top surface 702 of the second encapsulation layer, 207, is shaped to extract TEL light across all angles. The shaping can be formed by techniques such as but not limited to casting, moulding, injection moulding, embossing, laser trimming, imprinting and curing and machining. The shaping of the second encapsulant can also act as a means of altering the far field emission shape of the TEL. The shape may comprise by not limited to hemispherical, semi-ellipsoidal, pyramidal, conical, frusto-conical, multi-faceted polyhedron or Johnson Solids (otherwise known as convex polyhedron).

Figure 8:
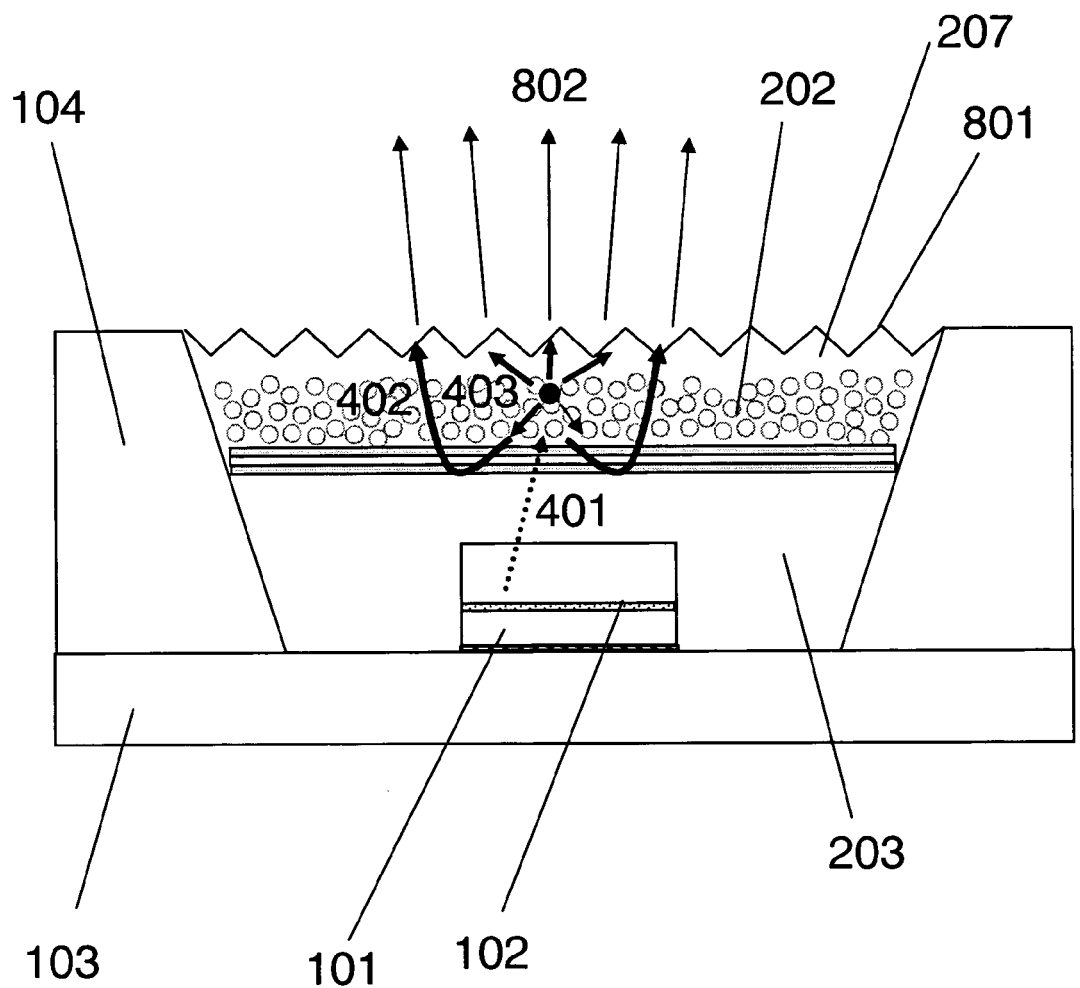
FIG. 8 shows a schematic cross sectional view of another example light emitting system of the present invention with a second encapsulation layer textured to allow for tailored far field emission; and, FIG. 9 shows a schematic cross sectional view of another example light emitting system of the present invention with the WC element residing as an individual sheet residing on the surface of the OTTC.

In another embodiment, the second encapsulant 207 may also be textured or corrugated in the micrometer or nanometer scale 801. This is shown in FIG. 8. The texturing allows for improved light extraction of any trapped TEL light residing in the encapsulation material as well as far field emission tailoring of the TEL, 802. The introduction of micro-optical texturing provides an increased probability of transmittance at the top encapsulant 207/air interface. The texturing may comprise but not limited to diffractive optical elements (DOE) such as Fresnel lenses, diffraction gratings, cross diffraction gratings, random texturing, regular or pre-defined arrangements of arbitrary shaped sub-regions. The said sub-regions may include but not limited to modulations on the surface of the said encapsulation, micro-pyramids, holes, rods inverted pyramids, frusto-pyramids, hemispheres or annuli. The texturing may be formed by similar techniques to those employed for shaping said encapsulant 207.

The far field emission tailoring of the TEL light allows the light to be more collimated than a Lambertian emitter, whereby most of the said TEL light is focussed in a narrow emission beam. This is advantageous for narrow spot lighting applications as well as light projection type applications. Alternatively, the far field emission tailoring may be optimised for light that is wide emitting. This is advantageous for flood lighting applications as well as LED direct Backlighting applications. In addition, more complex far field emissions may be designed for applications where complex far field profiles are required such as automotive headlights.

Figure 9:
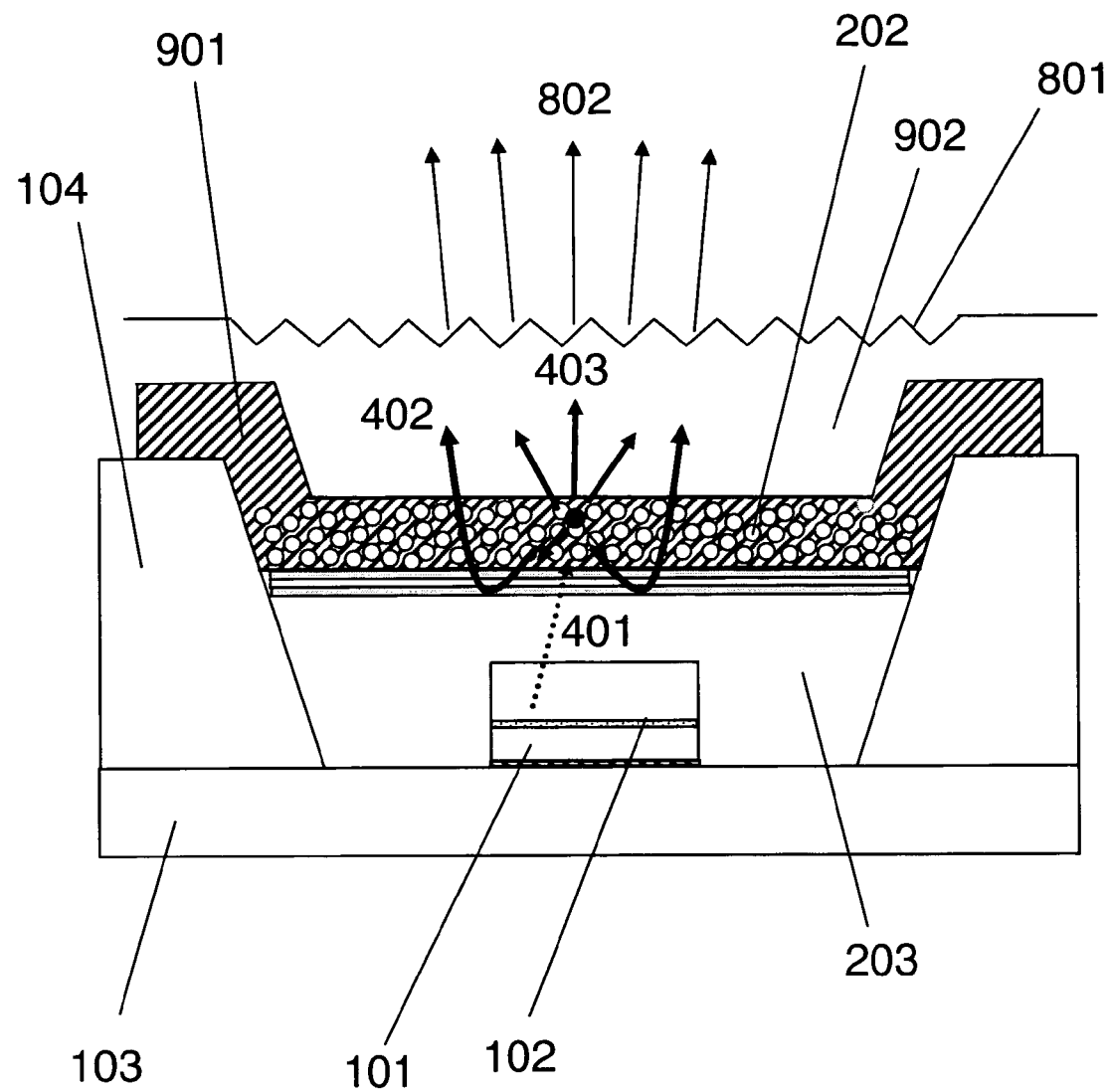

In another embodiment, the WC element of the light emitting system further comprises of a single or multiple layer. Each layer may be capable of re-emitting light at different wavelengths, whereby the said TEL is a superposition of the different wavelengths. The WC element may be formed of a group comprising an individual WC sheet, 901, deposited or dispensed layers that is introduced in the light emitting system as shown in FIG. 9. The individual WC sheet of the light emitting system may be physically attached to the OTTC layer and at least partially exposed to the light generated by the LED. The WC sheet may comprise of an effective refractive index matched to the OTTC layer and the first encapsulation layer. The WC sheet can comprise of a uniform surface or a corrugated shape that conforms to the surface of the light emitting module.

The WC sheet, 901, can be composed but not restricted to an encapsulation material with the WC element embedded and the encapsulation materials can be selected from the same group as the first encapsulation layer 203. The introduction of the WC sheet into the light emitting module provides many benefits; the ability to test the WCLE intensity and chromaticity prior to the attach onto the light emitting module thus improving colour binning of the resulting light emitting system, the ability to recycle the WC element in the light emitting system without damage to the LED.

Subsequently a second encapsulation layer may be disposed on the surface of the WC sheet 901, this can be applied externally on the WC sheet prior to attach to the light emitting module or in-situ following the attach of the WC sheet to the light emitting module.

Method of Manufacture

In a second aspect of the present invention, a method of manufacture of a light emitting system is proposed. It is an object of the present invention that the OTTC layer or multiple layers are deposited at low ambient temperatures to prevent stress associated with high temperature deposition as well as preventing irreversible damage to the underlying said first encapsulant and the said WC element. This is especially important if the encapsulant comprises of an optically transparent silicone, elastomer or gel whereby extended exposure to temperatures greater than 200° C. may give rise to detrimental changes in properties of the material.

The submount is initially attached to a reflector cup. The LED is attached to the base of the submount and is aligned to reside inside the reflector cup. The LED wire bonds are applied and attached to an external leads frame. The region surrounding the LED is filled with the first encapsulant. In the case of a silicone, the encapsulant may be applied by injecting a known well defined volume or weight of encapsulant into the reflector cup cavity.

The encapsulant is heat or UV cured and subsequently the OTTC layer is deposited. The deposited may preferably comprise of, but not restricted to, the following evaporation or sputtering techniques: Plasma assisted or enhanced deposition, Ion Beam assisted deposition, electron beam assisted deposition, Remote Plasma assisted deposition, electron beam evaporation, open and closed field magnetron sputtering.

In the present example the WC sheet is prepared ex-situ. A known weight of WC element namely a phosphor in the present case is introduced into the sheet carrier material by use of high speed, centrifugal or ultrasonic or other mixing technique. The sheet carrier material may additionally comprise of a silicone, PMMA, Perspex, polymer, elastomer, acrylate, resin or other material. The WC element and the sheet carrier material are cast into a mould and cured to set the silicone. The WC sheet is removed from the mould and aligned and attached to the light emitting modules.

The second encapsulation material may be cast into a textured or shaped mould and post curing the textured sheet may be applied and affixed to the top surface of the light emitting module. Any excess cured encapsulation surrounding the reflector cup may be laser trimmed. Alternatively, the second encapsulation material may be applied to the top surface of the light emitting module. In order to define the shape of the second encapsulant a mechanical template or mold is pressed on the surface and the said second encapsulant is cured. Following the curing stage the mold is removed to reveal the textured or shaped encapsulation layer. The light emitting systems may subsequently be separated if a volume process was employed.

The invention claimed is:

1. A light emitting module comprising:
a light emitting device having a light generating region for generating light when activated;
a submount comprising a thermally conductive material, the light emitting device being attached to the submount;
a wavelength converting element comprising a layer of material capable of absorbing light having a first wavelength generated by the light emitting device and re-emitting light having a second wavelength, the second wavelength being different to the first wavelength; and
a conductive element which is arranged to be at least partially in physical contact with the wavelength converting element and at least partially located in a light path of the generated light, the conductive element comprising at least one layer of inorganic material which is thermally conductive, having a thermal conductivity greater than that of the wavelength converting element, and which is optically transparent at the first and second wavelengths,
wherein the wavelength converting element and the conductive element form part of a unitary integrated structure with the light emitting device, the layers of the conductive element having been fabricated over the light emitting device using a deposition technique, and
wherein the conductive element comprises at least two stacked layers of different inorganic materials which are optically transparent at the first and second wavelengths, said at least one of the at least two stacked layers of inorganic material having a lower thermal conductivity than one or more of the other stacked layers, wherein the conductive element is adapted to be thermally conducting in a plane parallel to the layers of inorganic material and to provide a thermal barrier in a direction perpendicular to the plane.

2. A light emitting module according to claim 1, wherein the conductive element comprises three stacked layers of inorganic material which are optically transparent at the first and second wavelengths, wherein the middle layer of the three layers has a lower thermal conductivity than the other two layers.

3. A light emitting module according to claim 1, wherein the at least two stacked layers of inorganic material are adapted to provide an optical bandpass filter whereby at least 50% of re-emitted light incident on the conductive element is reflected and at least 50% of generated light incident on the conductive element is transmitted.

4. A light emitting module according to claim 1, wherein the at least two stacked layers of inorganic material are adapted to provide an optical anti-reflection coating for generated light incident on the conductive element.

5. A light emitting module according to claim 1, wherein the at least two stacked layers of inorganic material are adapted to provide an optical colour correction filter for light incident on the conductive element.

6. A light emitting module according to claim 1, wherein at least part of the conductive element is disposed between the light emitting device and the wavelength converting element.

7. A light emitting module according to claim 1, wherein the conductive element comprises a material or combination of materials selected from Aluminium Nitride, amorphous Aluminium Nitride, crystalline Aluminium Nitride, Aluminium Oxide, amorphous Aluminium Oxide, Silicon Nitride, Diamond Like Carbon, Fluorinated Diamond Like Carbon, CVD Diamond, Tantalum Pentoxide and Hafnium Oxide.

8. A light emitting module according to claim 1, wherein the conductive element is partially in contact with the submount.

9. A light emitting module according to claim 1, wherein the wavelength converting element comprises a sheet of wavelength converting material affixed to the light emitting module.

10. A light emitting module according to claim 1, wherein the conductive element is in-filled with dispersed thermally conductive features.

11. A light emitting module according to claim 10, wherein the thermally conductive features comprise one or more of dielectric or metal colloids, dielectric or metal nanoshells, nano-columns, nano-rice or arbitrary shaped nanoclusters.

12. A light emitting module according to claim 1, wherein the light emitting module further comprises a first encapsulant disposed at least partially on an upper surface of the light emitting device.

13. A light emitting module according to claim 12, wherein the first encapsulation is in-filled with dispersed thermally conductive features.

14. A light emitting module according to claim 1, further comprising a reflector cup.

15. A light emitting module according to claim 14, wherein the reflector cup comprises a thermally conductive material and the conductive element is partially in contact with the reflector cup.

16. A light emitting module according to claim 1, further comprising a second encapsulant disposed at least partially on the wavelength converting element and the inorganic optically transparent thermally conductive element.

17. A light emitting module according to claim 16, wherein a profile of an upper surface of the second encapsulant is selected from concave, hemispherical, semi-ellipsoidal, convex, multifaceted polyhedron, pyramidal, conical, frusto-conical, and modulated.

18. A light emitting module according to claim 16, wherein an upper surface of the second encapsulant is patterned.

19. A light emitting module according to claim 18, wherein the upper surface of the second encapsulant is patterned so as to act as one of a grating, a Fresnel lens, and a Diffractive Optical Element (DOE).

20. A method of manufacturing the light emitting module of claim 1, wherein the at least two layers of inorganic material of the conductive element are deposited using a low temperature deposition techniques selected from evaporation, sputtering, plasma assisted deposition, plasma enhanced deposition, Ion Beam assisted deposition, electron beam assisted deposition, Remote Plasma assisted deposition, electron beam evaporation, open and closed field magnetron sputtering.

* * * * *